(12) United States Patent
Shiraishi

(10) Patent No.: US 7,599,112 B2
(45) Date of Patent: Oct. 6, 2009

(54) MULTILAYER-FILM MIRRORS, LITHOGRAPHY SYSTEMS COMPRISING SAME, AND METHODS FOR MANUFACTURING SAME

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 172 days.

(21) Appl. No.: 11/544,483

(22) Filed: Oct. 6, 2006

(65) Prior Publication Data

US 2007/0081229 A1   Apr. 12, 2007

Related U.S. Application Data

(60) Provisional application No. 60/728,388, filed on Oct. 18, 2005.

(30) Foreign Application Priority Data

Oct. 11, 2005   (JP)   ............... 2005-295856

(51) Int. Cl.
  *G02B 5/08* (2006.01)
(52) U.S. Cl. .................. 359/359; 359/584; 359/586
(58) Field of Classification Search .............. None
  See application file for complete search history.

(56) References Cited

U.S. PATENT DOCUMENTS

| 5,757,017 | A  |   | 5/1998  | Braat            |         |
|-----------|----|---|---------|------------------|---------|
| 6,392,792 | B1 | * | 5/2002  | Naulleau         | 359/360 |
| 6,833,223 | B2 |   | 12/2004 | Shiraishi        |         |
| 7,050,237 | B2 | * | 5/2006  | Chapman          | 359/574 |
| 2002/0084425 | A1 |   | 7/2002 | Klebanoff et al. |        |
| 2002/0171922 | A1 | * | 11/2002 | Shiraishi et al.| 359/359 |
| 2003/0008148 | A1 |   | 1/2003 | Bajt et al.      |         |
| 2003/0008180 | A1 |   | 1/2003 | Bajt et al.      |         |

(Continued)

FOREIGN PATENT DOCUMENTS

EP   1 152 435 A1   7/2001

(Continued)

OTHER PUBLICATIONS

Berning, "Survey of Computational Methods and Techniques in Thin Film Optics," *Physics of Thin Films*, 1963, pp. 84-100, vol. 1, Academic Press.

(Continued)

*Primary Examiner*—Lee Fineman
(74) *Attorney, Agent, or Firm*—Klarquist Sparkman, LLP

(57) ABSTRACT

Multilayer-film (MLF) reflective mirrors are disclosed that have a highly precise surface profile. An exemplary MLF reflective mirror includes multilayer film in which layers of molybdenum (Mo) and layers of silicon (Si) are periodically deposited in an alternating manner on the surface of a mirror substrate. One or more selected regions of the multilayer film have been "shaved" away layer-wise as required to impart an in-plane distribution of removed material sufficient to correct a wavefront error in light reflected from the mirror. After such "layer-machining," a single-layer film of Si (or Si-containing material) is applied to fill in the machined areas and restore the original contour, as designed, for the surface of the multilayer film. I.e., the Si film has a thickness distribution corresponding to the depth profile of material removed from the multilayer film. A capping layer can be deposited uniformly on the surface of the single-layer film.

22 Claims, 14 Drawing Sheets

U.S. PATENT DOCUMENTS

| | | |
|---|---|---|
| 2003/0081722 A1 | 5/2003 | Kandaka et al. |
| 2003/0147139 A1 | 8/2003 | Kandaka et al. |
| 2004/0061868 A1 | 4/2004 | Chapman et al. |
| 2004/0256047 A1 | 12/2004 | Sekine |
| 2005/0109278 A1 | 5/2005 | Liang et al. |
| 2005/0117233 A1 | 6/2005 | Kanazawa et al. |
| 2005/0157384 A1 | 7/2005 | Shiraishi et al. |
| 2006/0040418 A1 | 2/2006 | Takaoka |

FOREIGN PATENT DOCUMENTS

| | | |
|---|---|---|
| JP | 2003-14893 | 1/2003 |
| WO | WO 01/41155 A1 | 6/2001 |

OTHER PUBLICATIONS

Braat, "Phase correcting layers in EUV imaging systems for microlithography," *Proceedings of OSA TOPS on Extreme Ultraviolet Lithography*, 1996, pp. 152-155, vol. 4, Optical Society of America.

Gwyn et al., "Extreme ultraviolet lithography," *J. Vac. Sci. Technol.*, Nov./Dec. 1998, pp. 3142-3149, B 16(6), American Vacuum Society.

Kinoshita et al., "Soft x-ray reduction lithography using multilayer mirrors," *J. Vac. Sci. Technol.*, Nov./Dec. 1989, pp. 1648-1651, B7(6), American Vacuum Society.

Stuik et al., "Peak and integrated reflectivity, wavelength and gamma optimization of Mo/Si and Mo/Be multilayer, multielement optics for extreme ultraviolet lithography," *J. Vac. Sci. Technol.*, Nov./Dec. 1999, pp. 2998-3002, B 17(6), American Vacuum Society.

Yamamoto et al., "Layer-by-layer design method for soft-x-ray multilayers," *Applied Optics*, Apr. 1992, pp. 1622-1630, vol. 31, No. 10, Optical Society of America.

Yamamoto, "Sub-nm Figure Error Correction of an EUV Multilayer Mirror by Its Surface Milling," *7th International Conference on Synchrotron Radiation Instrumentation, Book of Abstracts*, 2000, 1 page.

Yamamoto, "Sub-nm figure error correction of an extreme ultraviolet multilayer mirror by its surface milling," *Nuclear Instruments and Methods in Physics Research A*, 2001, pp. 1282-1285, 467-468, Elsevier Science B.V.

Majkova et al., "Figure Error Correction by Reflection Wavefront Control of Cu Ka Grazing Incidence Multilayer Mirrors," *Optical Review*, Vol. 10, No. 5, pp. 398-401, 2003.

European Search Report mailed May 28, 2009, from Epc Application No. 06 81 1216.8.

\* cited by examiner

MULTILAYER-FILM MIRRORS, LITHOGRAPHY SYSTEMS COMPRISING SAME, AND METHODS FOR MANUFACTURING SAME

CROSS REFERENCE TO RELATED APPLICATION

This application claims the benefit of U.S. Provisional Application No. 60/728,388, filed Oct. 18, 2005, incorporated herein by reference in its entirety. This application also claims priority to Japan Patent Application No. 2005-295856, filed on Oct. 11, 2005, incorporated herein by reference in its entirety.

FIELD

This disclosure relates to multilayer-film reflective mirrors in which a multilayer film is formed on a surface of a mirror substrate. The disclosure also relates to methods for manufacturing multilayer-film reflective mirrors, and to projection-exposure systems (notably, lithography systems) comprising at least one such multilayer-film reflective mirror.

BACKGROUND

In recent years, with advances in miniaturization of semiconductor integrated circuits, projection-exposure systems have been developed that use, instead of the ultraviolet (UV) light utilized by older projection-exposure systems, extreme ultraviolet ("EUV") light. EUV light has substantially shorter wavelengths (for example, approximately 11 to 14 nm) than the UV light used previously. The shorter wavelength of EUV light improves the resolving power of optical systems that had reached their diffraction limits with respect to UV light. See Japan Laid-open Patent Document No. 2003-14893.

In configuring a projection-exposure system using EUV light (such a system is called an "EUV lithography" system, abbreviated "EUVL" system), there are no known materials that both transmit EUV light and exhibit sufficient refraction to such light to be useful as EUV lenses. Consequently, in an EUVL system, the constituent optical systems must be configured using EUV-reflective mirrors. But, in this wavelength range, the mirrors must be either oblique-incidence mirrors that utilize total reflection due to their refractive index being slightly smaller than 1, or multilayer-film mirrors in which the respective phases of multiple fronts of weakly reflected light at layer interfaces are superposed constructively in the reflected light to obtain high overall reflectance.

A EUV-reflective mirror employed in an EUVL system must be formed with a highly accurate and precise reflective-surface shape (surface "figure") having extremely small figure errors with respect to wavefront aberration of reflected light. However, machining such a mirror is very difficult. Hence, techniques have been developed that are applied after the multilayer film has been formed on the reflective surface and that involve "shaving" away one layer at a time in selected regions of the multilayer-film reflective surface. This layer-shaving effectively corrects aberrations arising even from sub-nanometer figure errors. See International Patent Publication No. 01/41155.

In the case of a multilayer film comprising alternating layers of molybdenum (Mo) and silicon (Si), shaving the multilayer-film surface can result in an easily oxidized Mo layer being exposed to the atmosphere. Consequently, a single layer of Si or other oxidation-preventing substance, a ruthenium (Ru) layer, or other "capping" layer (to prevent oxidation of the exposed Mo layer) is normally applied at least in the shaved regions. The ruthenium (Ru) layer or other "capping" layer may also prevent carbon contamination in the multilayer film.

Because optical Ru layers are similar in many ways to Mo layers, depositing a Ru layer as a capping layer on the surface of a shaved multilayer film causes a considerable change in the phase of the reflected wavefront. The magnitude of the change depends upon the amount of film shaved away. The effect arises due to the fact that the Ru capping layer is conventionally formed over the entire surface, including in locations other than regions in which Mo-layer shaving has occurred. The capping layer also changes the reflectance of the shaved regions, causing irregularities in light propagation in the optical system.

SUMMARY

In view of the foregoing, objects of the invention are to provide multilayer-film reflective mirrors having a precise reference-surface shape, methods for manufacturing such multilayer-film reflective mirrors, and exposure systems comprising such multilayer-film reflective mirrors. These various aspects are described herein.

One aspect is directed to multilayer-film reflective mirrors, of which an embodiment comprises a mirror substrate defining a reflective surface comprising a multilayer film. The multilayer film comprises respective layers comprising Mo and respective layers comprising Si stacked in a periodic alternating manner on the reflective surface. In at least one selected region of the multilayer film, at least one layer is removed to impart, over the "top" surface of the multilayer film, a desired in-plane distribution of removed multilayer-film material. A single-layer film of Si, or of a material comprising Si, is situated on the top surface of the multilayer film to fill regions of the multilayer film from which material has been removed and to provide a "top" surface that substantially restores the as-designed contour of the reflective surface. The single-layer film has a thickness profile corresponding to the distribution of removed multilayer-film material. A substantially uniform-thickness capping layer is situated on the top surface of the single-layer film.

Another aspect is directed to methods for manufacturing multilayer-film reflective mirrors, of which an embodiment comprises forming a multilayer film on a figured surface of a mirror substrate, thereby forming a reflective surface having a contour. The multilayer film comprises multiple layer pairs of Mo and Si that are deposited periodically in an alternating manner. In at least one selected region of a "top" surface of the multilayer film, the multilayer film is "layer-machined" to remove at least one layer of the multilayer film to produce a desired in-plane depth distribution of removed multilayer-film material. Then, a single-layer film of Si, or of a material comprising Si, is applied to the layer-machined surface of the multilayer film to fill corresponding formed in the selected regions formed by localized removal of the multilayer-film material. The "top" surface of the single-layer film is planarized or otherwise provided with a contour that substantially restores the contour of the reflective surface. The single-layer film has a thickness distribution that substantially matches the depth distribution of the removed multilayer-film material. A capping layer is formed with a substantially uniform thickness on the top surface of the single-layer film.

Yet another aspect is directed to exposure systems (e.g., lithographic projection-exposure systems). An embodiment of such a system comprises a reflective optical system, of which at least one reflective mirror comprises a multilayer-film reflective mirror according to any of the instant embodiments, or manufactured using any of the method embodiments described herein.

In any of various embodiments of multilayer-film reflective mirrors as described herein, a single-layer film of Si or of a material comprising Si, is provided with a substantially planar "top" surface, or with a "top" surface having a particular surface profile such as one that is consistent with the figure profile of the reflective surface of the mirror. The single-layer film is situated on the "top" surface of the multilayer film of which one or more locations have experienced removal of at least one constituent layer to create an error-offsetting thickness profile. Since the single-layer film is on the surface of the multilayer film, the single-layer film also has a depth distribution that substantially conforms to the surface profile of the multilayer film. With such a configuration of the single-layer film, even if a uniform thickness of a capping layer is present on the "top" layer of the single-layer film, changes in phase and reflectance that otherwise would arise from variations in the amount of material removed from the multilayer film are prevented. Consequently, multilayer-film reflective mirrors having highly precise surface profiles are provided.

In the various method embodiments, a single-layer film of Si, or of a material comprising Si, is applied to the layer-machined multilayer film. The single-layer film has a substantially planar "top" surface or a top surface having a contour that is consistent with an as-designed contour of the reflective surface of the mirror. The single-layer film has a thickness profile that substantially corresponds with a depth profile of the multilayer film resulting from removal of at least one layer of the multilayer film in the selected areas of the multilayer film. The capping layer is applied at substantially uniform thickness on the "top" surface of the single-layer film. Hence, changes in phase and reflectance that otherwise would arise from removing material from the top surface of the multilayer film are prevented, and multilayer-film reflective mirrors having highly precise surface profiles are manufacturable.

According to yet another aspect, exposure systems are provided, of which an embodiment comprises at least one multilayer-film reflective mirror having a highly precise surface profile as disclosed herein. Such systems provide, among various benefits, satisfactory exposure of extremely fine pattern features.

DETAILED DESCRIPTION

The following description is set forth in the context of representative embodiments that are not intended to be limiting in any way.

The following description and other portions of this disclosure, including the claims, may use terms such as "up," "down,", "upper," "lower," "top," "bottom," "left," "right," "vertical," "horizontal," and the like. These terms are used herein to facilitate understanding of the relationships of various components with respect to an exemplary orientation. But, these terms are not intended to be construed in any manner that limits the disclosure to the literal meanings of these words. For example, as a result of simply turning a thing over, a "top" surface becomes a "bottom" surface, but the thing itself is unchanged.

Figure 1:
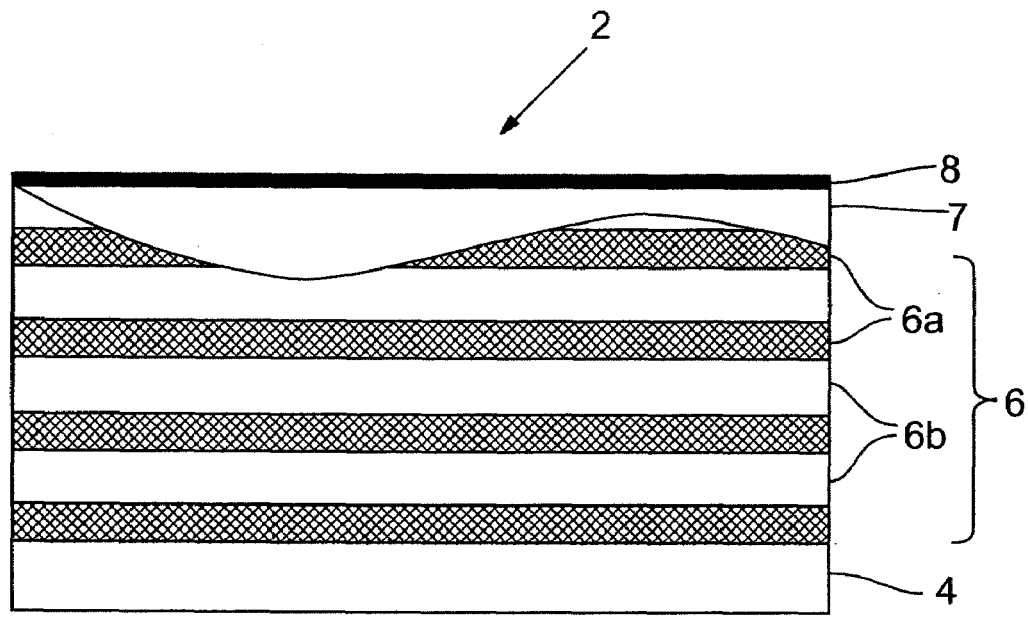
FIG. 1 is an elevational sectional view of a portion of the multilayer-film reflective mirror according to the first embodiment.

A multilayer-film reflective mirror according to a first embodiment is explained referring to the drawings. The multilayer-film reflective mirror is used, for example, in an EUV exposure device or the like that uses extreme ultraviolet light (EUV light) as the exposure light. FIG. 1 is an elevational section schematically depicting a portion of the multilayer-film reflective mirror 2 of this embodiment. The multilayer-film reflective mirror 2 comprises a multilayer film 6, having a structure in which layers 6a comprising molybdenum (Mo) and layers 6b comprising silicon (Si) are deposited periodically in an alternating manner on the surface of a mirror substrate made of a low-thermal-expansion glass polished to a precise shape (figure profile). A Si single-layer film 7 is deposited on the multilayer film 6 as an oxidation-prevention film. A capping layer 8, comprising a ruthenium (Ru) layer, is deposited on the Si single-layer film 7 to prevent carbon contamination and oxidation of the Si single-layer film 7. The multilayer film 6 comprises multiple layer-pairs of Mo layers 6a and Si layers 6b. In FIG. 1, however, only four layer-pairs of Mo and Si are shown.

Portions of the surface of the multilayer film 6 are removed ("shaved" or "machined" away) as required so as to impart an in-plane distribution of the amount removed, so as to correct the wavefront of light reflected from the surface. The Si single-layer film 7 has a thickness profile that substantially corresponds to the profile of removed material of the multilayer film 6. The "top" surface of the Si single-layer film 7 is shown as being substantially flat (planar) in the figure but actually has a profile that substantially restores the as-designed surface profile of the reflective surface of the mirror (e.g., the surface profile of the multilayer film). The Ru capping layer 8 is deposited uniformly on the Si single-layer film 7, desirably at uniform thickness.

In the FIG. 1 embodiment the Si single-layer film 7 is effectively an intermediate layer situated substantially on the surface of the top-most Si layer 6b of the multilayer film 6. Hence, despite the presence of the Ru capping layer 8 in this embodiment, wherein the Ru capping layer is deposited uniformly on the surface of the Si single-layer film 7, phase changes and reflectance changes that otherwise would arise from removal machining are substantially prevented.

Figure 2:
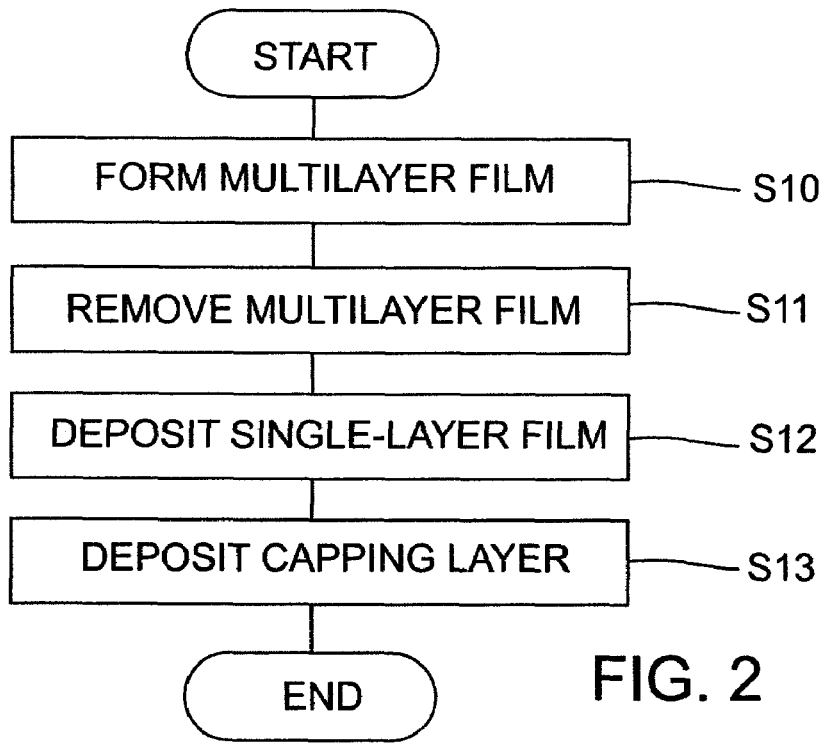
FIG. 2 is a flowchart depicting steps in a method for manufacturing a multilayer-film reflective mirror according to the first embodiment.

Next, a method for manufacturing the first embodiment of the multilayer-film reflective mirror 2 is described, referring to the flowchart of FIG. 2. First, a multilayer film 6, having a structure in which Mo layers 6a and Si layers 6b are deposited periodically in an alternating manner, is formed on a mirror substrate 4 (desirably low-thermal-expansion glass), polished with high precision (step S10). Desirably, a magnetron-sputtering film-deposition device is used to deposit these layers on the reflective surface of the mirror substrate 4. Thus formed, the multilayer film 6 has multiple layer-pairs, of which the period length is in the range of 6.9 nm to 7.5 nm.

Figure 3:
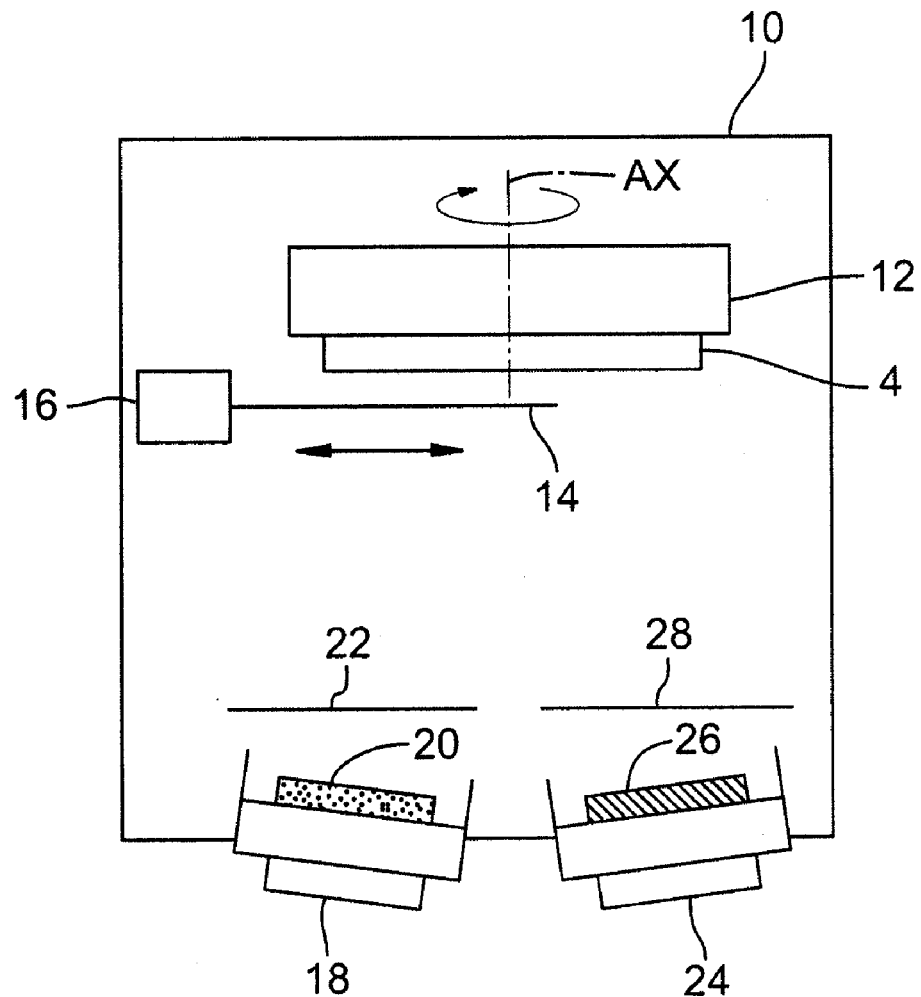
FIG. 3 shows the configuration of a magnetron-sputtering device used for forming layers on a mirror substrate according to the first embodiment.

FIG. 3 shows certain features of a magnetron-sputtering film-deposition device that comprises a substrate-holder 12 accommodated within a vacuum chamber 10 evacuated to a suitable vacuum level. The substrate holder 12 holds the mirror substrate 4. A rotational driving mechanism (not shown) holds the mirror substrate 4 while rotating it about a rotational axis AX.

The magnetron-sputtering film-deposition device further comprises a film-thickness-distribution correction plate 14 that is accommodated within the vacuum chamber 10. The film-thickness-distribution correction plate 14 is positioned in the vicinity of the mirror substrate 4 and is configured to move in the directions of the arrow in the drawing by means of a correction-plate-driving mechanism 16. By moving the film-thickness-distribution correction plate 14 in the depicted directions and adjusting the amount of film-deposition particles reaching the mirror substrate 4, the thickness of the film deposited on the mirror substrate 4 is controlled.

The magnetron-sputtering film-deposition device also comprises a first cathode 18, using a molybdenum (Mo) plate 20 as a first target material, and a first target shutter 22. Process gas is introduced into the vacuum chamber 10, and by applying a voltage to the first cathode 18, a plasma is generated in the vicinity of the Mo plate 20. By means of this plasma, the Mo plate 20 is sputtered, and the sputtered particles of Mo accumulate on the mirror substrate 4. The first target shutter 22 is opened during Mo-film deposition, and is closed during Si-film deposition, described below.

The magnetron-sputtering film-deposition device further comprises a second cathode 24, using a silicon (Si) plate 26 as a second target material, and a second target shutter 28. Process gas is introduced into the vacuum chamber 10, and by applying a voltage to the second cathode 24, a plasma is generated in the vicinity of the Si plate 26. By means of this plasma, the Si plate 26 is sputtered, and the sputtered particles of Si accumulate on the mirror substrate 4. The second target shutter 28 is opened during Si-film deposition, and is closed during Mo-film deposition.

Next, the surface of the multilayer film 6 formed in step S10 is removed, imparting an in-plane distribution of the amount of the multilayer film 6 removed (step 11).

Normally, whenever multiple reflective mirrors are used in a reflecting-optical system of an EUV exposure system, the figure error (FE) allowed in each reflective mirror, with respect to the wavefront error (WFE) of the reflecting-optical system, is given by Equation (1):

$$FE = WFE/2/\sqrt{n} \ (RMS) \tag{1}$$

Here, n is the number of reflective mirrors of the optical system. In a reflecting-optical system, both incident light and reflected light are affected by figure errors, resulting in wavefront errors (aberrations) being proportional to twice the figure error. Hence, Equation (1) includes division by 2. The figure error (FE) allowed for each reflective mirror is, for wavelength λ and number n of reflective mirrors, given by Equation (2):

$$FE = \lambda/28/\sqrt{n} \ (RMS) \tag{2}$$

For example, if the wavelength (λ) is 13 nm, the figure error allowed for each reflective mirror in a reflecting-optical system comprising four reflective mirrors is 0.23 nm RMS, and the figure error allowed for each reflective mirror in a reflecting-optical system comprising six reflective mirrors is 0.19 nm RMS. Whenever a multilayer-film reflective mirror 2 of the instant embodiment is used in an EUV exposure device, the allowed figure error is similarly calculated. However, it is extremely difficult to manufacture a mirror substrate having a reflective surface with such a highly precise surface figure. Even if the mirror substrate is polished to high precision, subsequent deposition of a multilayer film on it may cause the reflected wavefront to exhibit errors in wavefront shape.

Figure 4:
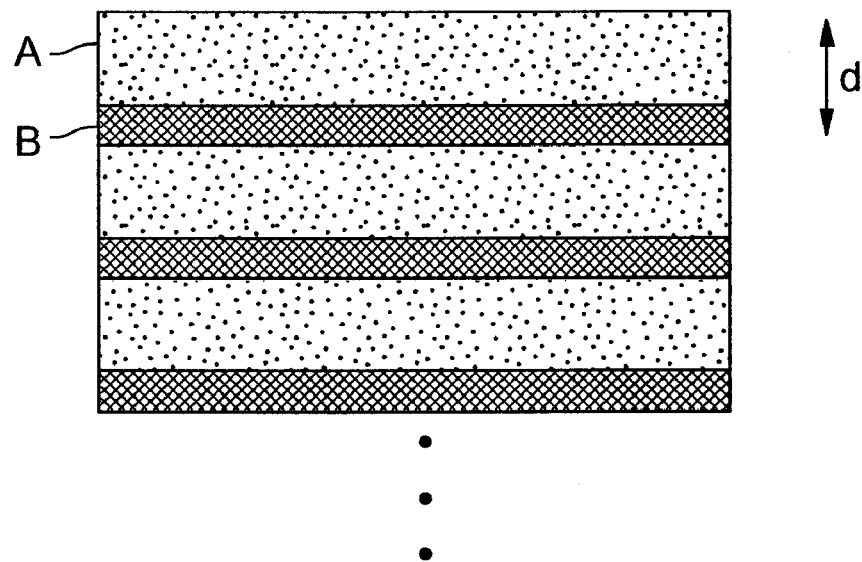
FIG. 4 depicts a step of a method for correcting figure errors of a multilayer-film reflective mirror.
Figure 5:
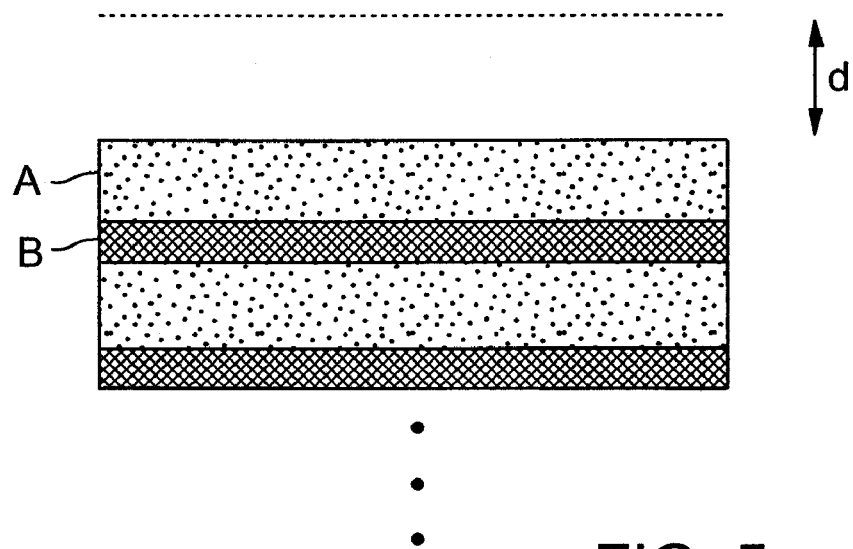
FIG. 5 depicts another step of a method for correcting figure errors of a multilayer-film reflective mirror.

Technology has been developed in which, by shaving off the surface of the multilayer film one layer at a time in selected locations, effective correction of sub-nanometer figure errors is possible (see International Patent Publication no. 01/41155). For example, consider a case in which one layer-pair is locally removed, as shown in FIG. 5, from the surface of a multilayer film in which two types of material A and B are layered in an alternating manner with a fixed period length d, as shown in FIG. 4. The optical-path length OP in a layer-pair having thickness d, for a beam propagating in a direction perpendicular to the surface of the multilayer film (FIG. 4), is $OP = n_A d_A + n_B d_B$. Here, $d_A$ and $d_B$ denote the respective thicknesses of the layers, wherein $d_A + d_B = d$. Further, $n_A$ and $n_B$ are the respective refractive indices of the materials A and B.

In FIG. 5 the optical-path length OP' of the portion of the thickness d removed from the multilayer-film layer-pair in the uppermost surface is given by OP'=nd. Here n is the refractive index of a vacuum, where n=1. That is, by removing the one or more of the uppermost layers of the multilayer film, the optical-path length traversed by a beam passing therethrough is changed. This is, in effect, optically equivalent to modifying the surface figure by the amount of change of the optical-path length. The change in optical-path length (i.e., the change in surface shape) $\Delta$ is given by $\Delta=OP'-OP$.

Because, in the EUV wavelength range, the refractive indices of materials are close to unity, $\Delta$ is a small quantity. Thus, by locally shaving off one or more layers as required, layer-by-layer from selected location(s) on the surface of the multilayer-film reflective mirror, the surface shape can be precisely corrected. For example, consider a case in which a Mo/Si multilayer film is used at a wavelength of 13.5 nm. Because the light is substantially directly incident on the mirror surface, it is assumed that the thickness d of a layer-pair is 6.9 nm, that the thickness $d_{Mo}$ of each Mo layer is 2.415 nm, and that the thickness $d_{Si}$ of each Si layer is 4.485 nm. The refractive index $n_{Mo}$ of Mo at a wavelength of 13.5 nm is 0.92, and the refractive index $n_{Si}$ of Si at this wavelength is 0.998. Using these numbers, the change in optical-path length is calculated. The optical-path length OP, prior to shaving off a layer-pair from a region of the surface of the multilayer-film reflective mirror, is 6.698 nm; the optical-path length OP' after shaving off a layer-pair is 6.9 nm, and the change in optical-path length $\Delta=OP'-OP=0.202$ nm.

Thus, by locally shaving off a layer-pair, the surface shape is corrected by the equivalent of 0.2 nm. In the case of a Mo/Si multilayer film, because the refractive index of each Si layer to EUV light is close to unity, the change in optical-path length $\Delta$ depends mainly on the presence or absence of the Mo layers, and depends hardly at all on the presence or absence of the Si layers. Hence, when removing one or more layers of a multilayer film, there is no need to control the thickness of the Si layers accurately. In the above-described example, the thickness of Si layers is 4.485 nm, and it is sufficient to stop the removal machining midway through the thickness of a Si layer. That is, by performing layer-removal machining with a precision of several nanometers, surface-shape correction can be performed in 0.2-nm increments.

Figure 6:
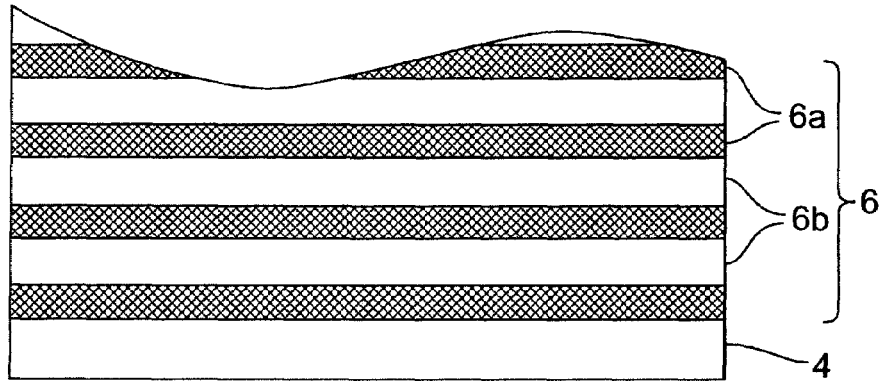
FIG. 6 is an elevational section of a portion of a multilayer-film reflective mirror that has been subjected to figure-error correction according to the first embodiment.

Hence, in step S11 (FIG. 2), first the reflected wavefront of EUV light from the multilayer-film reflective mirror 2, after depositing the multilayer film 6, is measured. If the measured reflected wavefront has an error with respect to the desired wavefront, the amount of the multilayer film 6 that should be locally machined away to correct the wavefront is determined. Based on the determined amount of removal, removal-machining of the multilayer film 6 is performed in the selected area(s). FIG. 6 shows an example configuration of a multilayer-film reflective mirror 2 after local removal-machining of the surface of the multilayer film 6, but before depositing the Si single-layer film 7 and the Ru capping layer 8. The multilayer film 6 comprises multiple layer-pairs each comprising a respective Mo layer 6a and a respective Si layer 6b. In FIG. 6, however, only four layer-pairs of Mo and Si are shown.

Figure 7:
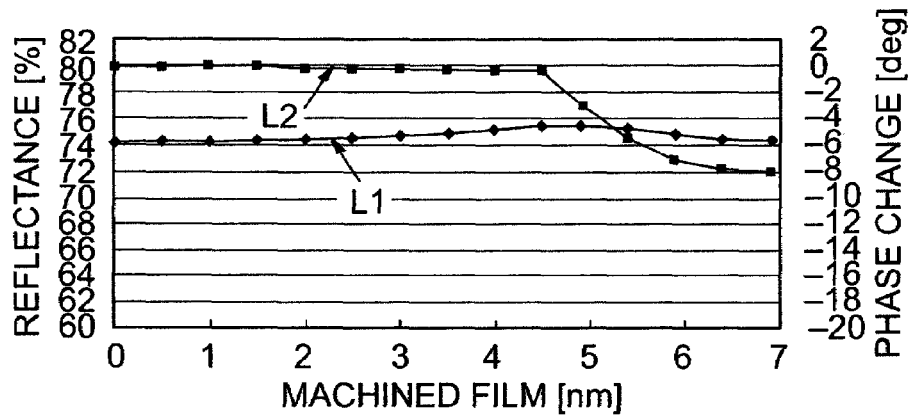
FIG. 7 is a graph of reflectance and phase changes, as functions of amount of the multilayer film actually removed, exhibited by a multilayer-film reflective mirror that has been subjected to figure-error correction.

FIG. 7 is a graph of reflectance and phase changes exhibited by the multilayer-film reflective mirror 2, as functions of the depth of layer-removal machining (i.e., the amount of film machined) in step S11. The curve L1 indicates the rate of change of reflectance for EUV light at a wavelength of 13.5 nm, and the curve L2 indicates changes in phase. The change in phase when the machining reaches the depth of the first layer-pair (period length 6.9 nm) of the multilayer film 6 is approximately 8°. The corresponding change in the wavefront for $\lambda=13.5$ nm is $8°/360°\times13.5$ nm=0.30 nm. For comparison, if 6.9 nm of the surface of the mirror substrate had been removed by machining, the change in wavefront would be equal to twice the period length, or 13.8 nm. In the instant embodiment the effect on the wavefront of the amount of film machined on the surface of the multilayer film 6 is 0.30 nm/13.8 nm=1/46 as great.

Next, referring to FIG. 2, a Si single-layer film 7 is deposited on the surface of the multilayer film 6 that has been subjected to local layer-removal machining in step S11. The "top" surface of the Si single-layer film 7 is shown as being substantially planar, but it actually has a profile that substantially restores the as-designed surface profile of the reflective surface of the mirror. I.e., the Si film 7 is formed with a depth (thickness) profile that substantially conforms to the depth profile of material previously removed from the multilayer film 6 (step S12). The Si single-layer film 7 functions as an oxidation-prevention film for the Mo layers, thereby preventing oxidation of the Mo layer 6a that has been exposed on the surface as a result of layer-removal machining in step S11. As an alternative to the Si single-layer film 7, a single-layer film of a material comprising Si, such as for example $SiO_2$ or another compound, may be deposited.

Figure 8:
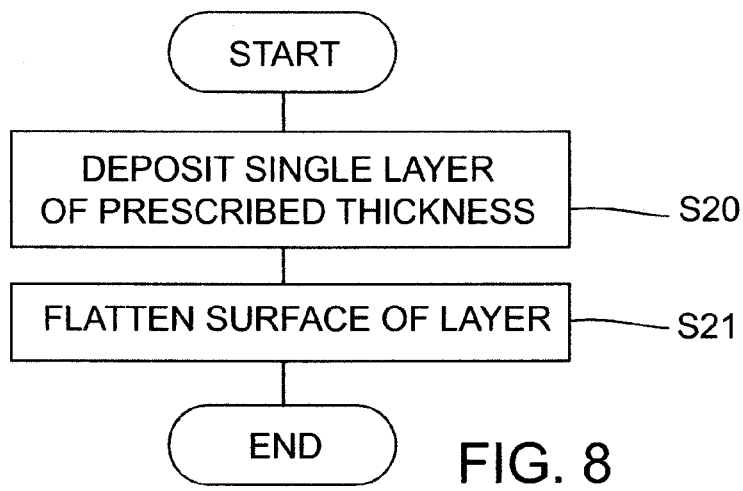
FIG. 8 is a flowchart of steps in a method for depositing a Si single-layer film on a surface of a multilayer film.

FIG. 8 is a flowchart depicting an embodiment of a method for depositing the Si single-layer film 7. First, a Si single-layer film 7 of a prescribed thickness is deposited on the surface of a multilayer film 6 which has been subjected to localized layer-removal machining in step S11 of the process in FIG. 2 (step S20). That is, a Si single-layer film 7 is deposited uniformly, to a thickness that is equal to or greater than the amount of machined film locally removed, onto the surface of the multilayer film 6.

Next, an amount of the Si single-layer film 7, deposited in step S20, is removed according to the thickness of multilayer film 6 previously removed, i.e., according to the thickness of the multilayer film that had been locally machined away, so that the "top" surface of the Si single-layer film 7 substantially restores the as-designed profile of the surface of the multilayer film (step S21). That is, the Si single-layer film is formed having a depth (thickness) profile that substantially conforms to the depth profile of the multilayer film after layer-machining, thereby offsetting the effect of the layer-machining. The "top" surface of the Si single-layer film 7 is at substantially the same level as the multilayer film 6 prior to layer-removal machining.

Next, a Ru capping layer 8 is deposited uniformly at a thickness of approximately 2 nm on the surface of the Si single-layer film 7 deposited in step S12 (step S13). The Ru capping layer 8 prevents carbon contamination of the multilayer film 6, and prevents oxidation of the multilayer film 6 and of the Si single-layer film 7.

As an alternative capping layer (protective layer) to the Ru capping layer, a single layer of rhodium (Rh), niobium (Nb), platinum (Pt), or molybdenum (Mo) may be deposited. Further alternatively, a single layer of an alloy comprising Ru, Rh, Nb, Pt, or Mo may be deposited, or a single layer of $TiO_2$, $SiO_2$, $ZrO_2$, $MoSi_2$, or SiC may be deposited. Further alternatively, two or more of these layers may be formed as a capping layer. In addition, an adjustment layer may be formed below a single capping layer, or below a multi-layer capping layer, to facilitate formation of these layers and promote exhibition of their functions.

According to the multilayer-film reflective mirror and method of manufacture thereof of the first embodiment, a Si single-layer film having a flat surface is deposited on the surface of a multilayer film previously subjected to localized layer-removal machining. The Si single-layer film has a film thickness corresponding to the amount of the multilayer film previously removed. Hence, even if a Ru capping layer is deposited uniformly on the surface of the Si single-layer film, phase changes and reflectance changes due to the removal machining can be prevented.

Figure 9:
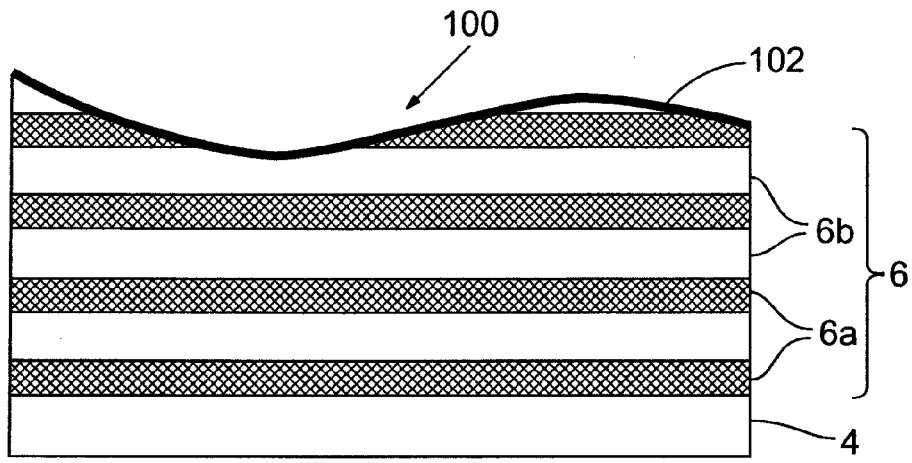
FIG. 9 is an elevational section showing the configuration of a multilayer-film reflective mirror according to the comparative example.
Figure 10:
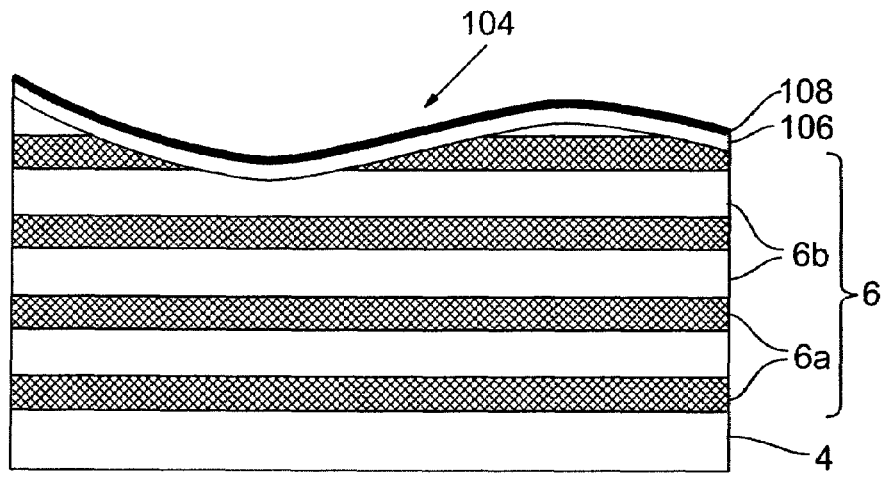
FIG. 10 is an elevational section showing the configuration of a multilayer-film reflective mirror according to the comparative example.

FIGS. 9 and 10 show the configuration of a multilayer-film reflective mirror 100 according to the comparative example. The multilayer-film reflective mirror 100 shown in FIG. 9 includes a Ru capping layer 102 of thickness 2 nm deposited uniformly directly on a multilayer film 6 previously subjected to localized layer-removal machining. In the multilayer-film reflective mirror 104 shown in FIG. 10, a Si single-layer film 106 having a thickness of 2 nm and a Ru capping layer 108 having a thickness of 2 nm are deposited uniformly on the multilayer film 6 previously subjected to localized layer-removal machining. The multilayer film 6 comprises multiple layer-pairs each comprising a respective Mo layer 6a and a respective Si layer 6b. In FIGS. 9 and 10, only four layer-pairs of Mo and Si are shown.

Figure 11:
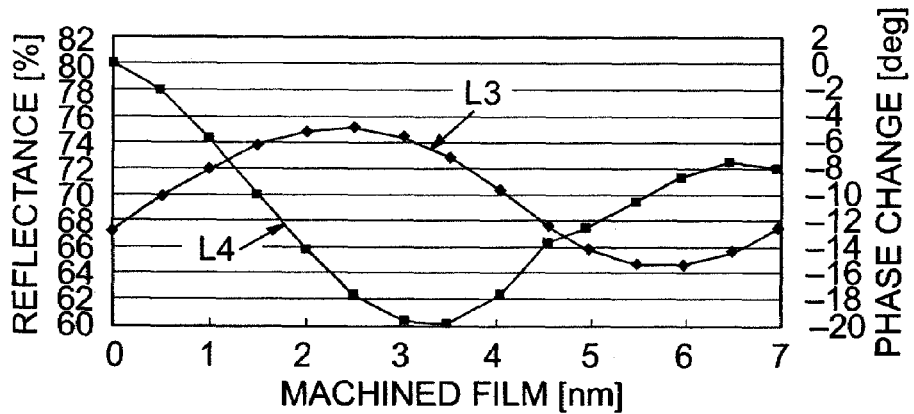
FIG. 11 is a graph of reflectance and phase changes, as functions of amount of the multilayer film actually removed, exhibited by a multilayer-film reflective mirror according to the comparative example.

The graph in FIG. 11 shows reflectance and phase change, as functions of machined-film thickness (nm), of the multi-layer-film reflective mirrors 100 and 104 shown in FIGS. 9 and 10. The curve L3 is the reflectance of EUV light of wavelength 13.5 nm, and the curve L4 is the phase change. The reflectance and phase change shown in the graph of FIG. 11 fluctuate greatly compared to the reflectance and phase change of a multilayer-film reflective mirror prior to depositing a Ru capping layer 102 or a Si single-layer film 106 and Ru capping layer 108 (see FIG. 7). This fluctuation is due to the fact that the Ru capping layers 102 and 108, which optically are substantially equivalent to the Mo layers 6a of the multilayer film 6, are deposited at positions at which a Mo layer 6a is not meant to be deposited. Hence, despite the fact that the reflected wavefront of the multilayer-film reflective mirror has been corrected by layer-removal machining of the surface of the multilayer film 6, the desired correction of the reflected wavefront is not obtained. Substantial fluctuations in reflectance also may give rise to transmission irregularities.

Figure 12:
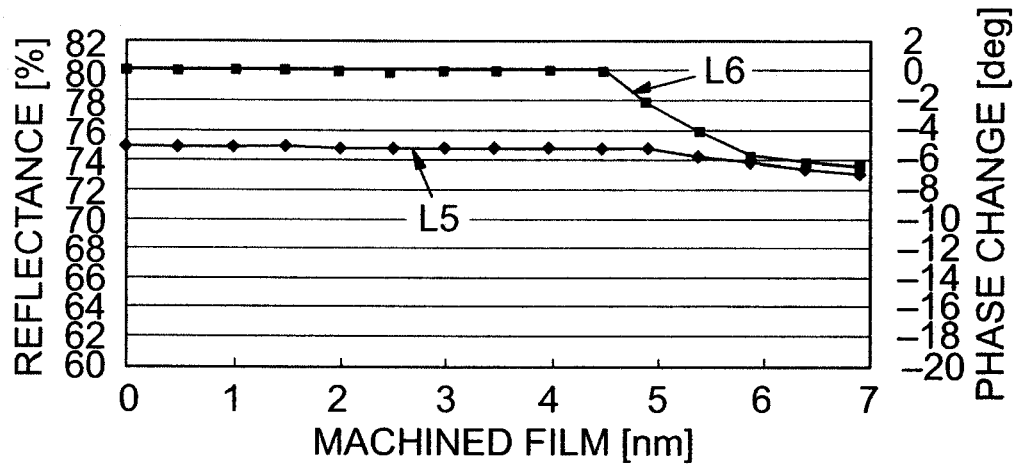
FIG. 12 is a graph of exemplary reflectance and phase changes, as functions of amount of the multilayer film actually removed, exhibited by a multilayer-film reflective mirror according to the first embodiment.

In contrast, the graph of FIG. 12 shows reflectance and phase change, as functions of thickness of film machined away, of the multilayer-film reflective mirror 2 of this embodiment. The curve L5 represents reflectance for EUV light of wavelength 13.5 nm, and the curve L6 represents the phase change. As shown in FIG. 12, there are no large fluctuations in reflectance or phase change such as are seen in the graph of FIG. 11, and the reflectance profile and phase-change profile are substantially the same as the reflectance profile and phase-change profile, respectively, immediately after performing localized layer-removal machining of the multilayer film 6, shown in FIG. 7. In FIG. 12, the change in phase when the film-machining amount reaches one layer-pair (period length 6.9 nm) of the multilayer film 6 is approximately 6.66°. The corresponding change in wavefront is 6.66°/360°×13.5 nm (wavelength)=0.25 nm. Normally, if 6.9 nm of the mirror substrate is removed by machining, the change in the wavefront is twice the period length, or 13.8 nm. Thus, the effect on the wavefront of machining the film at the surface of the multilayer film 6 is 0.25 nm/13.8 nm=1/55 as great.

That is, in a multilayer-film reflective mirror 2 of this embodiment, a Si single-layer film 7 having a contour-restoring "top" surface is deposited on the surface of the multilayer film 6 that previously had been subjected to localized layer-removal machining. The Si layer has a thickness profile that corresponds to (conforms to) the depth profile of the layer-machining, so that the Ru capping layer 8 is deposited where a top-most Mo layer 6a otherwise would have been deposited. Further, since no significant reflectance changes or phase changes occur due to the thickness of the newly deposited Si single-layer film 7, high-precision correction of the surface shape can be performed.

In the method for manufacturing a multilayer-film reflective mirror according to the first embodiment, the Si single-layer film 7 of prescribed thickness is deposited on the surface of the multilayer film 6 that had previously been subjected to layer-removal machining. The "top" surface of the Si single-layer film 7 is then "planarized," by which is meant that the top surface is formed to have a surface profile that is substantially the same as the as-designed surface profile of the reflective surface of the mirror. This profile restoration can be performed after forming the Si single-layer film 57, or the Si single-layer film 7 can be deposited in such a manner that the surface of the Si single-layer film 7 is at substantially the same level as the surface of the multilayer film 6 had been prior to the layer-removal machining. That is, the Si single-layer film 7 (the intermediate-layer) is deposited on the surface of the at least one region from which material of the multilayer film has been removed.

Figure 13:
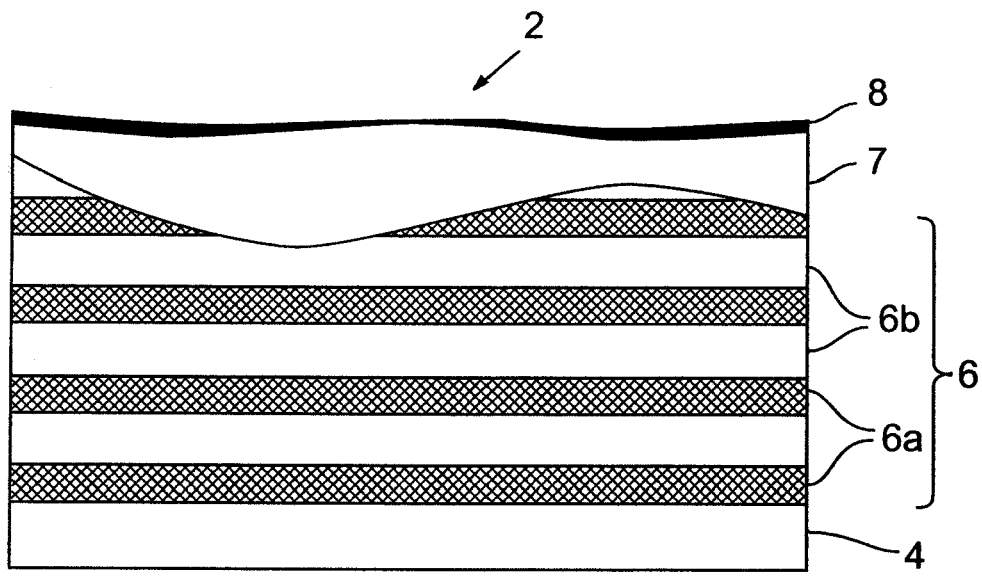
FIG. 13 shows a situation in which thickness errors of the Si single-layer film can occur in a multilayer-film reflective mirror.

In the first embodiment, the reflected wavefront error is minute even if the Si single-layer film 7 has thickness variations from the ideal surface contour. For example, suppose that, as shown in FIG. 13, the "top" surface of the Si single-layer film 7 does not have the desired contour (e.g., has an error of ±0.3 nm from the as-designed contour). By depositing the Ru capping layer 8 on the "top" surface of the Si single-layer film 7, the ±0.3 nm error in the thickness of the Si single-layer film 7 is retained. The multilayer film 6 comprises multiple layer-pairs of Mo layers 6a and Si layers 6b, but in FIG. 13 only four layer-pairs of Mo layers 6a and Si layers 6b are shown.

Figure 14:
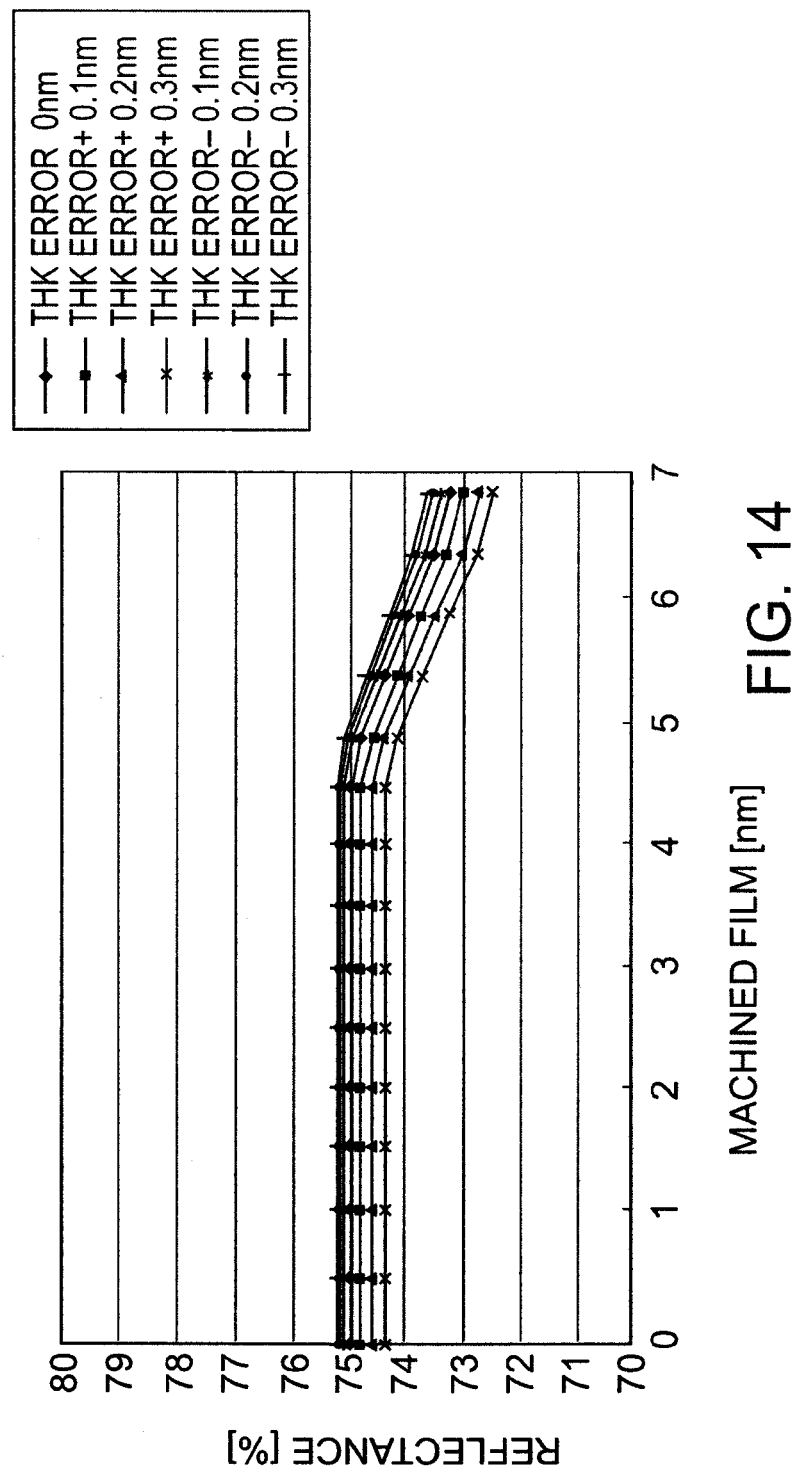
FIG. 14 is a graph of exemplary reflectance profiles resulting from thickness errors in a Si single-layer film in a multilayer-film reflective mirror.
Figure 15:
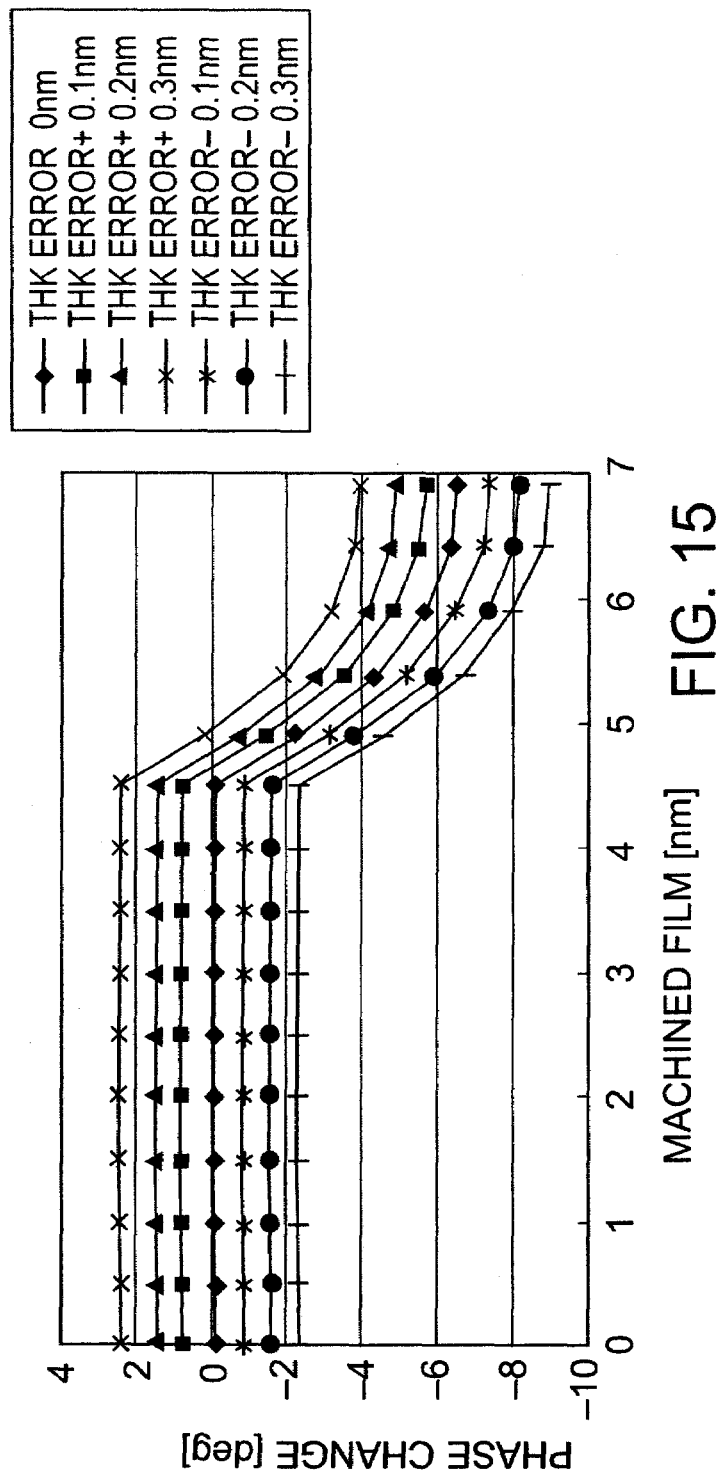
FIG. 15 is a graph of exemplary phase changes resulting from thickness errors in a Si single-layer film in a multilayer-film reflective mirror.

In this case, FIG. 14 is a graph showing changes in reflectance versus the amount of layer-machining performed on the multilayer-film reflective mirror 2 of FIG. 13. FIG. 15 is a graph showing changes in phase versus the amount of layer-machining performed on the multilayer-film reflective mirror 2 of FIG. 13. FIGS. 14 and 15 show changes in reflectance and phase accompanying various thicknesses of the multilayer film machined away. Thickness errors (THK ERROR) of the Si single-layer film 7 of ±0.3 nm, ±0.2 nm, and ±0.1 nm are very small compared to a case in which no thickness error is present (i.e., thickness error=0 nm).

Phase changes when the thickness error (THK ERROR) of the Si single-layer film 7 is ±0.3 nm are ±2.5°, compared to the phase changes when no thickness error is present. The change in the wavefront at this time is ±2.5°/360°×13.5 nm=±0.09 nm. Normally, with a thickness error of 0.3 nm, the change in the wavefront is twice the thickness error, or 0.6 nm. Therefore, the effect on wavefront of the thickness error in the Si single-layer film 7 is 0.09 nm/0.6 nm=approximately 1/7.

Figure 16:
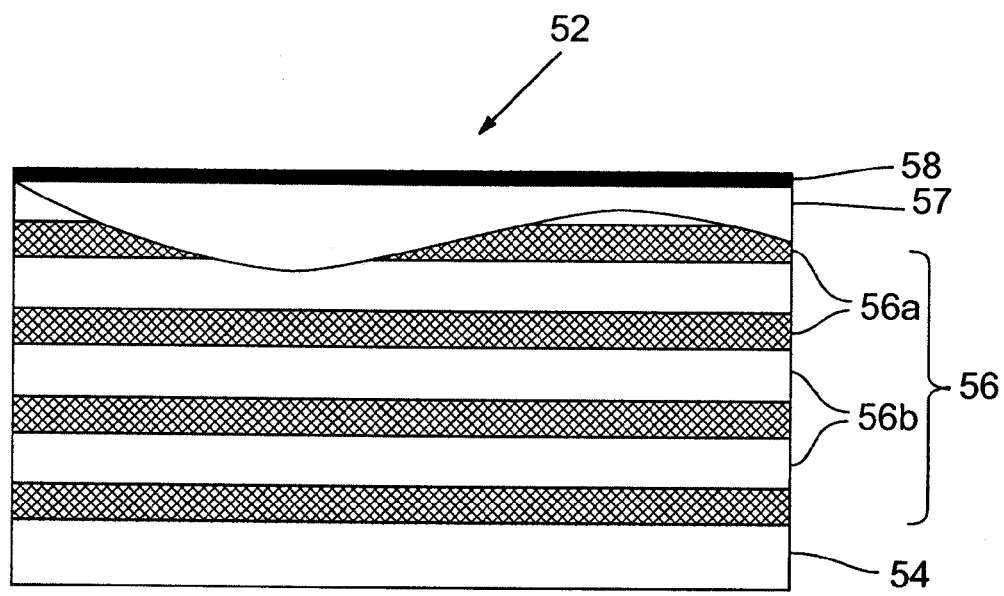
FIG. 16 is an elevational section showing a portion of a multilayer-film reflective mirror according to a second embodiment.

Next, the multilayer-film reflective mirror of a second embodiment of the invention is explained, referring to the drawings. The multilayer-film reflective mirror of the second embodiment is used in, for example, an EUV exposure system or the like that uses EUV light as the exposure light. FIG. 16 is an elevational section schematically depicting a portion of the multilayer-film reflective mirror 52 of this embodiment. The multilayer-film reflective mirror 52 comprises a multilayer film 56 comprising multiple Mo layers 56a and Si layers 56b deposited periodically in an alternating manner on a mirror substrate 54 made of low-thermal-expansion glass polished to a precise surface profile (shape). The multilayer-film reflective mirror also includes a Si single-layer film 57, deposited as an oxidation-prevention film on the multilayer film 56. The localized depth of machining of the surface of the Si single-layer film 57 is according to an in-plane distribution. A capping layer 58, comprising a layer of ruthenium (Ru), is deposited on the Si single-layer film 57 to prevent carbon contamination and oxidation of the Si single-layer film 57. The multilayer film 56 comprises multiple layer-pairs of Mo layers 56a and Si layers 56b, but in FIG. 15 only four layer-pairs of Mo and Si are shown.

The multilayer film 56 is formed by depositing multiple layer-pairs of Mo layers 56a and Si layers 56b using the magnetron-sputtering film-deposition device shown in FIG. 3. The multilayer film 56 is formed on the reflective face (surface) of the mirror substrate 54, with a period length in the range from 6.9 nm to 7.5 nm.

The surface of the multilayer film 56 is machined, as described above, so as to produce a desired an in-plane distribution of the removed amount that serves to correct the reflected wavefront. The Si single-layer film 57 has a thickness that, in any location of the film, is 0.4 nm to 1.2 nm thinner than the corresponding depth of material actually removed from the multilayer film 56. The Ru capping layer 58 is deposited at substantially uniform thickness on the "top" surface of the Si single-layer film 57. Thus, the Ru capping layer and the Si single-layer film 57 collectively restore the as-designed contour of the reflective surface of the mirror.

Figure 17:
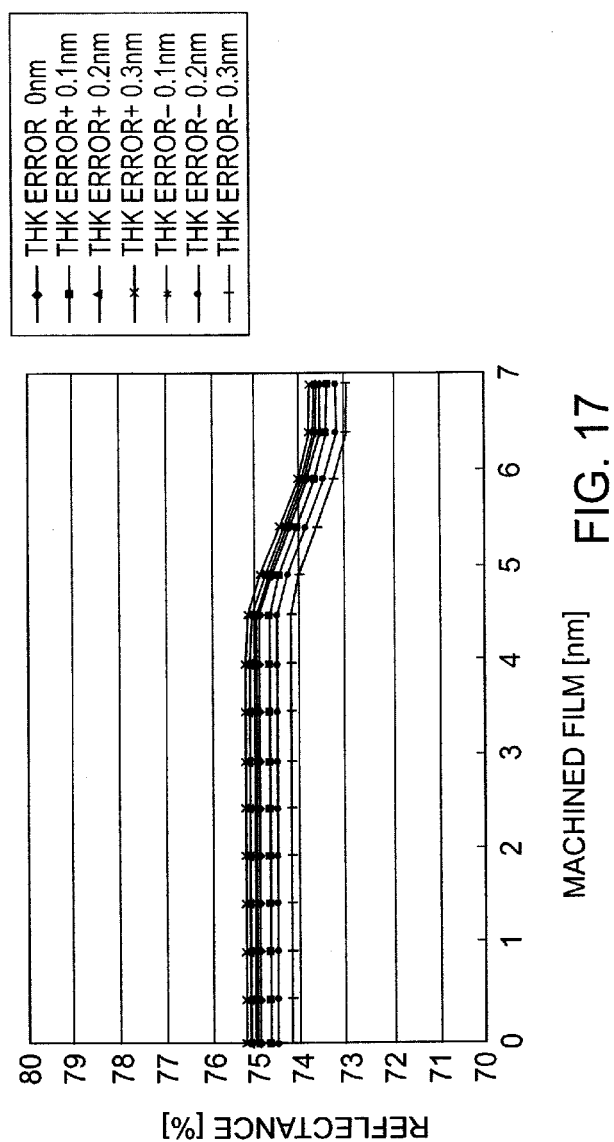
FIG. 17 is a graph showing exemplary reflectance changes exhibited by the multilayer-film reflective mirror of the second embodiment.
Figure 18:
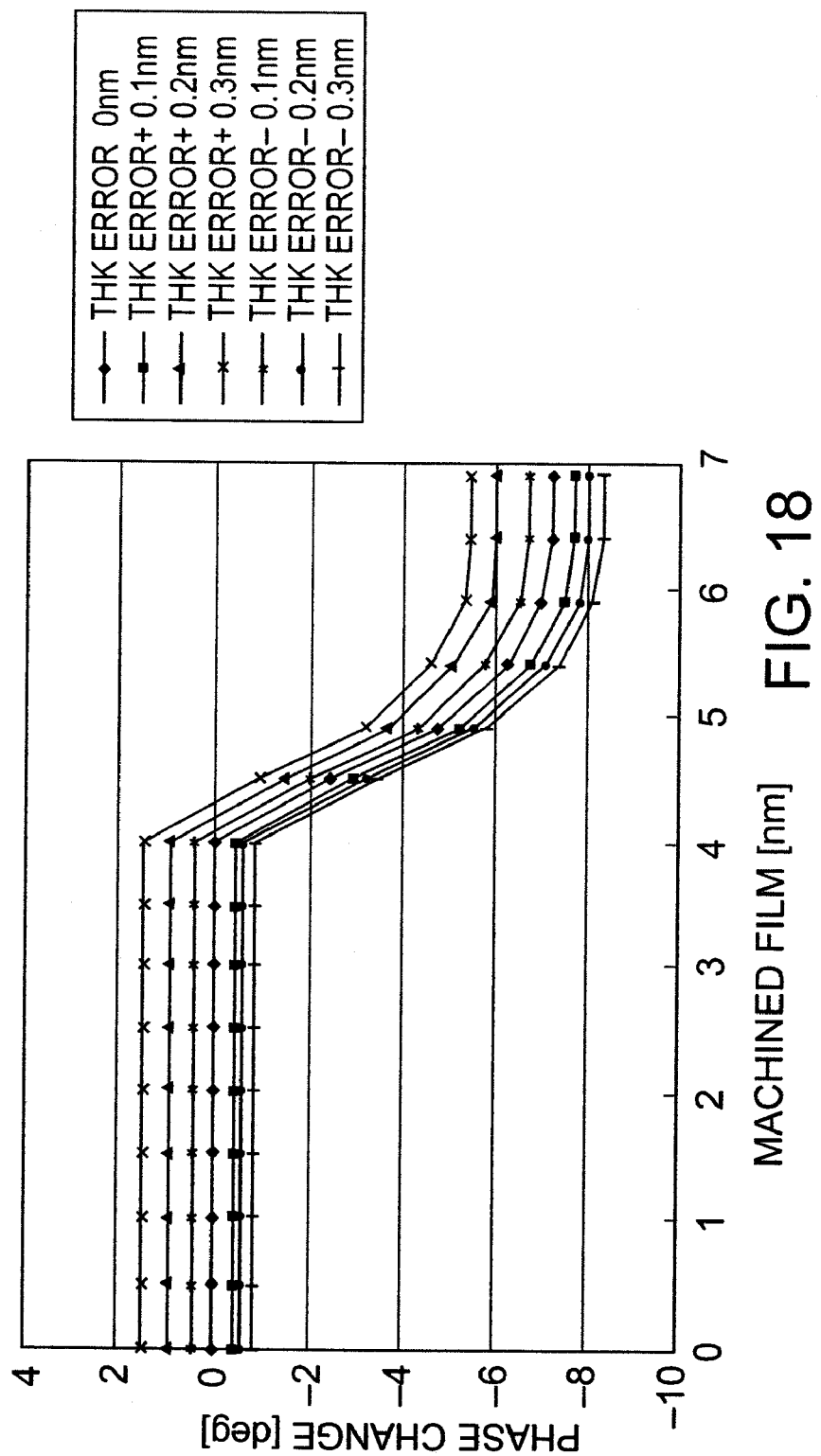
FIG. 18 is a graph showing exemplary phase changes exhibited by the multilayer-film reflective mirror of the second embodiment.

By making the film thickness of the Si single-layer film 57 in the range of 0.4 nm to 1.2 nm thinner than the removed thickness of the multilayer film 56, fluctuations in reflectance and phase change with thickness errors of the Si single-layer film 57 are reduced. FIG. 17 is a graph showing reflectance, as a function of thickness of film machined away, for the multilayer-film reflective mirror 52 of this embodiment. The reflectance changes are shown for cases in which there is no thickness error (THK ERROR of 0 nm) and in which thickness errors of ±0.3 nm, ±0.2 nm, and ±0.1 nm arise during deposition of the Si single-layer film 57. FIG. 18 is a graph of phase changes for the multilayer film 52 of this embodiment. Phase changes are shown for cases in which there is no thickness error (THK ERROR of 0 nm) and in which thickness errors of ±0.3 nm, ±0.2 nm, and ±0.1 nm arise during deposition of the Si single-layer film 57.

The fluctuations in reflectance and phase change shown in the graphs of FIGS. 17 and 18 reveal smaller spread compared to the graphs in FIGS. 14 and 15, pertaining to the first embodiment. That is, in FIGS. 17 and 18, the phase change caused by a thickness error in the Si single-layer film 57 of ±0.3 nm is from −0.8° to +1.4° relative to the phase change when there is no thickness error in the Si single-layer film, and the wavefront change at this time is ±0.045 nm. Hence, the effect of a thickness error in the Si single-layer film 57 on the wavefront is approximately 1/14, and when the thickness of the Si single-layer film 57 is from 0.4 nm to 1.2 nm thinner than the removed thickness of the multilayer film 56 at the respective locations, fluctuations in reflectance and phase change with thickness errors are small compared with cases in which the thickness of the Si single-layer film 57 is equal to the removed thickness of the multilayer film 56.

Whenever the thickness of the Si single-layer film 57 is made thinner by 0.4 nm than the corresponding removed thickness of the multilayer film 56, the effect on the wavefront of any thickness errors of the Si single-layer film 57 is minimized. Also, if the thickness of the Si single-layer film 57 is 1.2 nm less than the removed thickness of the multilayer film 56, the effect on reflectance fluctuations of thickness errors of the Si single-layer film 57 is minimized. Hence, if the thickness of the Si single-layer film 57 is denoted $d_1$ (nm), and the removed thickness of the multilayer film 56 is denoted $d_2$ (nm), the Si single-layer film 57 should be deposited so as to satisfy the condition $d_2 - 0.4 \leq d_1 \leq d_2 - 1.2$.

According to the second embodiment, the thickness of the Si single-layer film is less by 0.4 nm to 1.2 nm than the removed thickness of the multilayer film. As a result, even if an error occurs in the thickness of the Si single-layer film, the changes caused thereby to reflectance and phase change of the multilayer-film reflective mirror can be minimized, and a multilayer-film reflective mirror having a highly precise surface shape can be provided.

In the multilayer-film reflective mirror of the second embodiment, the Si single-layer film is deposited 0.4 nm to 1.2 nm thinner than the thickness of multilayer film actually removed. Alternatively, the uppermost Si layer alone of the multilayer film may be deposited 0.4 nm to 1.2 nm thinner than the other Si layers in the multilayer film. Thus, the Si single-layer film may be deposited at a thickness substantially equal to the removed thickness of the multilayer film.

The multilayer film of each of the multilayer-film reflective mirrors in each of the above-described embodiments is configured from alternating layers of Mo and Si. Alternatively, configurations using materials other than Mo and Si are possible. For example, the multilayer-film reflective mirrors configured from multiple layers, each comprising a different material selected from the group consisting of Ru, Mo, Rh, Si, Be, $B_4C$, and combinations thereof are possible. Also, a Si single-layer film is deposited as an oxidation-prevention film. Alternatively, silicon compounds such as, for example, $SiO_2$ or SiC or other materials may be deposited. In any event, it is desirable that the material actually used be one that exhibits minimal absorption of EUV light and has a refractive index near unity in the EUV wavelength range.

In the multilayer film of a multilayer-film reflective mirror according to any of the above-described embodiments, a magnetron-sputtering film-deposition device was used for film deposition. Alternatively, film deposition may be performed using any of various film-deposition devices other than a magnetron-sputtering film-deposition device. For example, an ion-beam-sputtering film-deposition device is possible.

Figure 19:
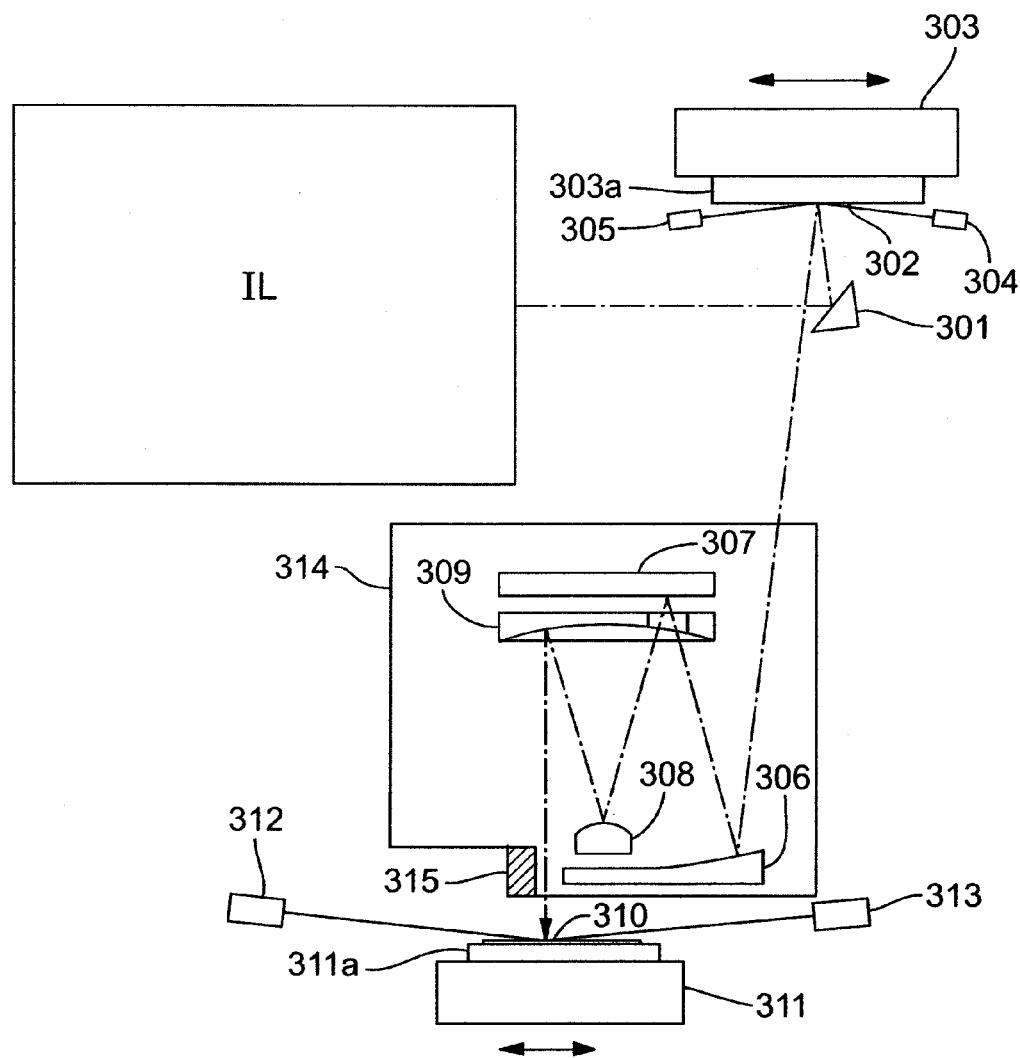
FIG. 19 is a schematic optical diagram of the configuration of an embodiment of an EUV exposure device of a third embodiment.

An EUV exposure system, according to a third embodiment of the invention is explained, referring to FIG. 19. The depicted system is a demagnifying (reducing) projection-exposure device. In the depicted system, the entire optical path is maintained in a state of high vacuum. The EUV exposure system comprises an illumination-optical system IL including an EUV light source. EUV light (in general, wavelengths from 5 to 20 nm are targeted; specifically, the 13 nm and 11 nm wavelengths are used) emitted from the illumination-optical system IL is reflected by the return mirror 301, and irradiates a reticle 302 on which is formed a pattern.

The reticle 302 is a reflection-type reticle, and is held by a chuck 303a fixed to a reticle stage 303. The reticle stage 303 is configured to perform movements of 100 mm or more in the scanning direction, and is configured to perform minute movements in a direction perpendicular to the scanning direction and in the optical-axis direction. The position of the reticle stage 303 in the scanning direction and in the direction perpendicular to the scanning direction is precisely controlled using a laser interferometer (not shown). The position in the optical-axis direction is controlled using a reticle-focus sensor, which comprises a reticle-focus optical transmitting system 304 and a reticle-focus optical receiving system 305.

In the reticle 302, a multilayer film (for example, Mo/Si or Mo/Be), which reflects EUV light, is deposited. An absorption layer (e.g., nickel (Ni) and aluminum (Al)) on this multilayer film is patterned. EUV light reflected by the reticle 302 is incident in the optical lens-barrel 314.

In the optical lens-barrel 314 are positioned multiple (four in this embodiment) mirrors 306, 307, 308, 309. At least one of these mirrors 306-309 comprises a multilayer-film reflective mirror of the first or second embodiment, or a multilayer-film reflective mirror manufactured using the method of the first embodiment. In the FIG. 19 embodiment, the projection-optical system comprises four mirrors; alternatively, six or eight mirrors may be used in the projection-optical system, in which event the numerical aperture (NA) of the projection-optical system can be made larger.

EUV light entering optical lens-barrel 314 is reflected by the mirror 306, and then reflected in succession by the mirrors 307, 308, 309. The EUV light exits the optical lens-barrel 314 and is incident on the wafer 310. The demagnification (reduction) ratio of the projection-optical system 314 is, for example, 1/4 or 1/5. In the vicinity of the optical lens-barrel 314 is placed an off-axis microscope 315 used for performing alignment of the wafer 310.

The wafer 310 is held by a chuck 311a fixed to a wafer stage 311. The wafer stage 311 is positioned in a plane perpendicular to the optical axis, and is configured to enable motion over, for example, 300 to 400 mm in the plane perpendicular to the optical axis. The wafer stage 311 is also configured to perform minute movements in the optical-axis direction. The position of the wafer stage 311 in the optical-axis direction is controlled by a wafer auto-focus sensor comprising a wafer auto-focus optical-transmitting system 312 and a wafer auto-focus optical-receiving system 313. The position of the wafer stage 311 in a plane perpendicular to the optical axis is controlled precisely using a laser interferometer (not shown).

At the time of exposure, the reticle stage 303 and wafer stage 311 are scanningly moved synchronously at respective velocities of which a ratio is equal to the demagnification ratio of the projection-optical system. An example is (movement velocity of reticle stage 303):(movement velocity of wafer stage 311)=4:1 or 5:1.

According to the EUV exposure system of this third embodiment, at least one of the mirrors of the projection-optical system 314 comprises a multilayer-film reflective mirror of the first or second embodiment or a multilayer-film reflective mirror manufactured by the manufacturing method of the first embodiment. Consequently, satisfactory exposures can be performed using an optical system comprising mirrors having precise surface shapes.

In the third embodiment, at least one of the mirrors 306-309 comprises a multilayer-film reflective mirror of the first or second embodiment, or comprises a multilayer-film reflective mirror manufactured using the method of the first embodiment. However, any of the mirrors of the illumination-optical system IL, the return mirror 301, the reticle 302, and the like may comprise a multilayer-film reflective mirror of the first or second embodiment, or may comprise a multi-layer-film reflective mirror manufactured using the method of the first embodiment.

A multilayer-film reflective mirror according to this invention can be used in X-ray optical systems other than an optical system of an EUV exposure system. For example, the multi-layer-film reflective mirror can be used with similar advantageous effect in a high-precision reflective optical system used in wavelength regions other than the X-ray region.

Figure 20:
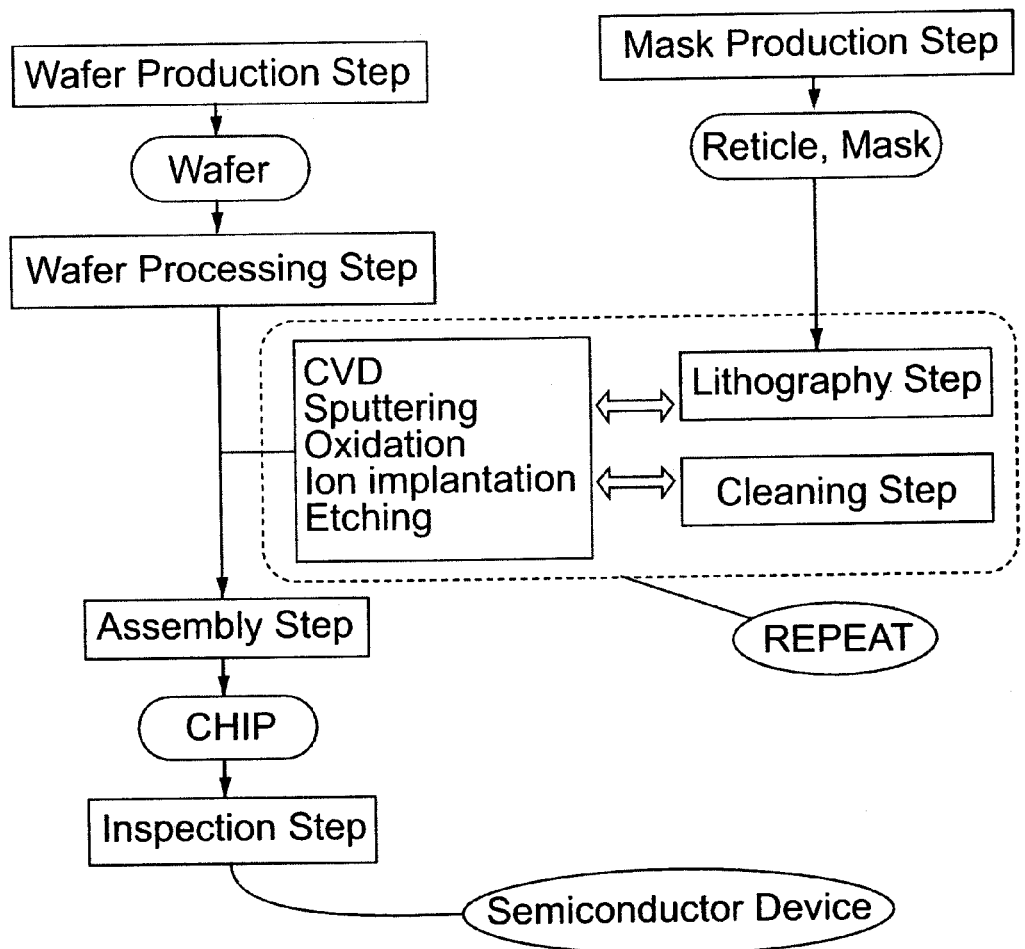
FIG. 20 is a process-flow diagram of a method for manufacturing a semiconductor device, the method including a lithography process performed using a lithography system as disclosed herein.

FIG. 20 is a flowchart of an exemplary microelectronic-fabrication method in which systems and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 21:
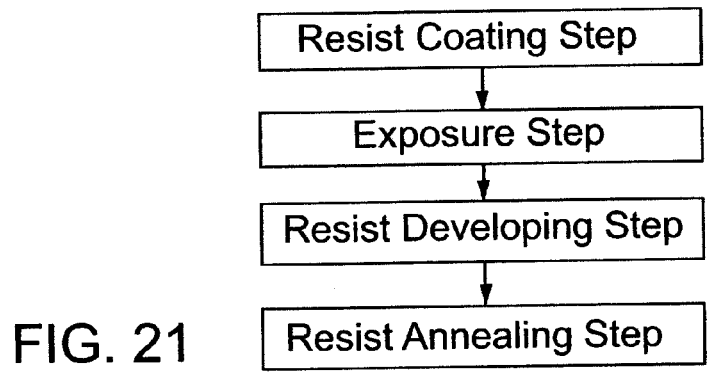
FIG. 21 is a process-flow diagram of an exemplary lithography process used in the method of FIG. 20.

FIG. 21 provides a flowchart of typical steps performed in microlithography, which is a principal step in the wafer-processing step shown in FIG. 20. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

EXAMPLES

Referring to FIG. 1, a Mo/Si multilayer film 6 was formed of 50 layer-pairs on a planar mirror substrate. Each Mo layer had a thickness of 2.415 nm, each Si layer had a thickness of 4.485 nm, and the period length was 6.9 nm. After layer-machining the surface of the multilayer film 6, a Si single-layer film 7 was applied to re-fill the machined areas. The "top" surface of the Si single-layer film was planarized to restore the intended planar contour of the mirror surface. Atop the Si single-layer film 7 was formed a Ru capping layer 8 having a uniform film thickness of 2 nm. The target reference "height" to which the Si single-layer film 7 was formed was the highest point of the surface of the Mo/Si multilayer film 6 prior to layer-machining.

In this example, made according to the first embodiment, the changes in phase and reflectance, as functions of layer-machining amount, are shown in FIG. 12, showing that precise wavefront control is achievable. The Ru capping layer ensures a durable multilayer-film reflective mirror that is resistant to contamination and oxidation.

Referring to FIG. 13, a Mo/Si multilayer film 6 was formed of 50 layer-pairs on a planar mirror substrate. Each Mo layer had a thickness of 2.415 nm, each Si layer had a thickness of 4.485 nm, and the period length was 6.9 nm. After layer-machining the surface of the multilayer film 6, a Si single-layer film 7 was used for re-filling the machined areas so as to re-planarize the "top" surface. Atop the Si single-layer film 7 was formed a Ru capping layer 8 having a uniform film thickness of 2 nm. However, thickness errors were introduced in the course of forming the Si single-layer film 7. Also, errors were introduced to the "top" surface of the Si single-layer film while machining it to a profile opposite the profile of the layer-machined multilayer film. Consequently, the profile of the "top" surface of the Si single-layer film was not completely planar, and had a thickness error of ±0.3 nm. The target reference "height" to which the Si single-layer film 7 was formed was the highest point on the surface of the Mo/Si multilayer film 6 prior to layer-machining.

In this example, made according to the second embodiment, the changes in phase and reflectance, as functions of layer-machining amount, are as shown in FIGS. 14 and 15, which show that precise wavefront control is achievable. The re-filling thickness error was ±0.3 nm, but the resulting wavefront error was within ±0.09 nm. Thus, the effect of the re-filling error was held to a small amount. The Ru capping layer ensured a durable multilayer-film reflective mirror that is resistant to contamination and oxidation.

Referring to FIG. 16, a Mo/Si multilayer film 56 was formed on a planar mirror substrate. The multilayer film had 50 layer-pairs, in which each Mo layer had a thickness of 2.415 nm, each Si layer had a thickness of 4.485 nm, and the period length was 6.9 nm. After layer-machining the surface of the multilayer-film, a Si single-layer film 57 was applied to re-fill the machined areas. The Si single-layer film 57 was planarized, and a Ru capping layer of uniform thickness was formed atop the Si single-layer film 57. The Si single-layer film 57 was deposited so as to have a "top" surface located 0.8 nm below the maximum contour "height" of the multilayer film 56. Thickness errors were introduced during re-filling with the Si single-layer film 57, and machining errors were introduced when machining the Si single-layer film 57 to have a profile opposite the layer-machined profile of the multilayer-film. Consequently, the "top" surface of the Si single-layer film 57 was not completely planar, and had a thickness error of ±0.3 nm. The target reference "height" to which the Si single-layer film 57 was formed was 0.8 nm lower than the height of the uppermost layer of the Mo/Si multilayer film 56 prior to layer-machining.

According to the third embodiment, the changes in phase and reflectance, as functions of layer-machining amount, are as shown in FIGS. 17 and 18, which show that precise wavefront control is achievable. The re-filling thickness error was ±0.3 nm, but the resulting wavefront error was within ±0.09 nm. Consequently, the effect of the re-filling error was held to a small amount. The Ru capping layer ensured a durable multilayer-film reflective mirror that is resistant to contamination and oxidation.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A multilayer-flim reflective mirror, comprising:
a mirror substrate comprising a surface;
a multilayer film on the surface of the mirror substrate, the multilayer film comprising multiple layer-pairs each comprising a respective layer of a first material and a respective layer of a second material to form a reflective surface having an area, the area including a region in which at least one of the layer-pairs has a non-uniform thickness distribution compared to layer-pairs outside the region, thereby forming a respective irregularity in a surface contour of the reflective surface in the region compared to outside the region;
an intermediate-layer of Si or of a material comprising Si, the intermediate layer being situated on the reflective surface and having a first surface and a second surface, the first surface being situated substantially at a surface of a top-most layer of the second material of the multilayer film, the first surface of the intermediate-layer being substantially complementary to the irregularity in the surface contour in the region, and the second surface of the intermediate layer providing a surface contour of the reflective surface in the region that substantially continues the surface contour of the reflective surface outside the region; and
a capping layer, having a substantially uniform thickness, on the second surface of the intermediate-layer.

2. The multilayer-film reflective mirror of claim 1, wherein the reflective surface is reflective to EUV light having a wavelength in a range of 11 nm to 14 nm.

3. The multilayer-film reflective mirror of claim 1, wherein the first material comprises Mo and the second material comprises Si.

4. The multilayer-film reflective mirror of claim 1, wherein the intermediate-layer is made of Si, $SiO_2$, SiC, or combinations thereof.

5. The multilayer-flim reflective mirror of claim 4, wherein the intermediate-layer comprises multiple layers each comprising a different material.

6. The multilayer-film reflective mirror of claim 1, wherein the intermediate-layer has a substantially flat second surface.

7. The multilayer-flim reflective mirror of claim 1, wherein the capping layer comprises a material selected from the group consisting of Ru, Ru alloys, Rh, Rh alloys, Nb, Nb alloys, Pt, Pt alloys, Mo, Mo alloys, $TiO_2$, $SiO_2$, $ZrO_2$, $MoSi_2$, and SiC, and combinations thereof.

8. The multilayer-film reflective mirror of claim 7, wherein the capping layer comprises multiple layers each comprising a different material.

9. An optical system, comprising a multilayer-film reflective mirror as recited in claim 1.

10. An exposure system, comprising an optical system as recited in claim 9.

11. A microelectronic-device manufacturing process, comprising:
(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure system as recited in claim 10, and using the exposure system to expose the resist with the pattern defined on the reticle.

12. A method of manufacture of a multilayer reflective mirror, comprising:
on a surface of a mirror substrate, forming a multilayer film comprising multiple layer-pairs each consisting of a respective layer of a first material and a respective layer of a second material, thereby forming a reflective surface having an area and a surface contour;
in a selected region of the reflective surface, the region having an area less than the area of the reflective surface, removing material of the multilayer film to a desired depth profile to produce a corresponding distribution, on the reflective surface, of breadth and depth of multilayer-film material removed;

on the reflective surface in the region from which material of the multilayer film has been removed, forming a substantially complementary-shaped unit of a material comprising Si, the unit being formed to have a maximal thickness $d_1$, corresponding to a maximal depth $d_2$ of multilayer-film material removed from the region, the unit having a surface that substantially follows the surface contour of the reflective surface outside the region; and forming a capping layer having substantially uniform thickness on the reflective surface including the surface of the unit of material comprising Si.

13. The method of claim 12, wherein the step of forming the single-layer film comprises:

depositing the unit of material comprising Si at a prescribed thickness on the reflective surface of the multilayer film; and removing, at one or more selected regions on the surface of the unit of material comprising Si, to planarize the surface of the unit.

14. The method of claim 12, wherein:
$d_1$ and $d_2$ are in units of nm; and $$d_2-0.4 \leq d_1 \leq d_2-1.2.$$

15. A multilayer-flim reflective mirror, comprising:
a mirror substrate comprising a surface;
a multilayer reflective film on the surface of the mirror substrate, the multilayer reflective film having a surface and an area and comprising multiple layer pairs each consisting of a respective layer of a first material having a refractive index $n_1$ to a selected wavelength of light and a respective layer of a second material having a refractive index $n_2$ to the selected wavelength wherein $n_2 \neq n_1$, the layer pairs having a period length d, the multilayer reflective film including at least one region having an area less than the area of the multilayer reflective film and extending depthwise from the surface at least one layer pair into the multilayer film and being occupied by a substantially complementary unit of the second material, the region including at least one location on the surface having a depth $d_2=N \cdot d$, wherein N is an integer $\geq 1$ and at which location the unit of second material has a thickness $d_1$ corresponding to $d_2$; and a capping layer having a substantially uniform thickness and extending over the surface of the multilayer reflective film and unit of the second material.

16. The multilayer-flim reflective mirror of claim 15, wherein, in the region the unit of the second material in the region has a depth profile that substantially corresponds to a depth profile of the region.

17. The multilayer-flim reflective mirror of claim 15, wherein the unit of the second material in the region has a maximal thickness substantially equal to a maximal depth of the region.

18. The multilayer-flim reflective mirror of claim 15, wherein the unit of the second material in the region has a thickness $d_1=d_2-1.2$ nm.

19. The multilayer-flim reflective mirror of claim 18, wherein: $d_1$ and $d_2$ are in units of nm; and $$d_2-0.4 \leq d_1 \leq d_2-1.2.$$

20. An optical system, comprising a multilayer-film reflective mirror as recited in claim 15.

21. An exposure system, comprising an optical system as recited in claim 20.

22. A microelectronic-device manufacturing process, comprising:

(a) preparing a substrate;
(b) processing the substrate; and
(c) assembling microelectronic devices formed on the substrate during steps (a) and (b), wherein step (b) comprises the steps of (i) applying a resist to the substrate; (ii) exposing the resist; and (iii) developing the resist; and step (ii) comprises providing a exposure system as recited in claim 21, and using the exposure system to expose the resist with the pattern defined on the reticle.

* * * * *

UNITED STATES PATENT AND TRADEMARK OFFICE
CERTIFICATE OF CORRECTION

PATENT NO. : 7,599,112 B2
APPLICATION NO. : 11/544483
DATED : October 6, 2009
INVENTOR(S) : Masayuki Shiraishi It is certified that error appears in the above-identified patent and that said Letters Patent is hereby corrected as shown below:

Cover Sheet - In Other Publications:

Page 2, line 19, "Control of Cu Ka" should be --Control of Cu $K_\alpha$--

In the Specification:

Column 2, line 55, "corresponding formed" should be --corresponding depression formed--

Column 4, line 52, ""down,"," should be --"down,"--

Column 9, line 64, "to (conforms to) to" should be --to (conform to)--

Column 11, line 15, "a desired an" should be --a desire--

Column 11, line 36, "multilayer film 52" should be --multilayer film 56--

Column 14, line 34, "(which an include" should be --(which can include--

In the Claims:

Column 15, line 63, "A multilayer-flim reflective mirror" should be --A multilayer-film reflective mirror--

Column 16, line 31, "A multilayer-flim reflective mirror" should be --A multilayer-film reflective mirror--

Column 16, line 36, "A multilayer-flim reflective mirror" should be --A multilayer-film reflective mirror--

Signed and Sealed this
Seventh Day of June, 2011

David J. Kappos
*Director of the United States Patent and Trademark Office*

Column 17, line 29, "A multilayer-flim reflective mirror" should be --A multilayer-film reflective mirror--

Column 18, line 10, "A multilayer-flim reflective mirror" should be --A multilayer-film reflective mirror--